United States Patent
Hsu et al.

[11] Patent Number: 5,796,151
[45] Date of Patent: Aug. 18, 1998

[54] SEMICONDUCTOR STACK HAVING A DIELECTRIC SIDEWALL FOR PREVENTION OF OXIDATION OF TUNGSTEN IN TUNGSTEN CAPPED POLY-SILICON GATE ELECTRODES

[75] Inventors: Wei-Yung Hsu, Dallas; Dirk N. Anderson; Robert Kraft, both of Plano, all of Tex.

[73] Assignee: Texas Instruments Incorporated, Dallas, Tex.

[21] Appl. No.: 770,019

[22] Filed: Dec. 19, 1996

[51] Int. Cl.$^6$ .................. H01L 29/76; H01L 29/94; H01L 31/62; H01L 23/58
[52] U.S. Cl. .................. 257/410; 257/67; 257/336; 257/344; 257/408; 257/410; 257/411; 257/412; 257/413; 257/640; 257/649
[58] Field of Search .................. 257/410, 411, 257/412, 413, 67, 336, 344, 408, 640, 649

[56] References Cited

U.S. PATENT DOCUMENTS

| | | | |
|---|---|---|---|
| 4,869,781 | 9/1989 | Euen et al. | 257/411 |
| 4,954,867 | 9/1990 | Hosaka | 257/412 |
| 5,034,789 | 7/1991 | Ohsima | 257/411 |
| 5,097,301 | 3/1992 | Sanchez | 257/412 |
| 5,258,645 | 11/1993 | Sato | 257/411 |
| 5,311,049 | 5/1994 | Tsuruta | 257/411 |
| 5,319,229 | 6/1994 | Shimoji et al. | 257/411 |
| 5,319,230 | 6/1994 | Nakao | 257/411 |
| 5,341,016 | 8/1994 | Prall et al. | 257/412 |
| 5,473,179 | 12/1995 | Hong | 257/411 |
| 5,600,165 | 2/1997 | Tsukamoto et al. | 257/411 |
| 5,606,192 | 2/1997 | Harada | 257/412 |
| 5,616,948 | 4/1997 | Pfiester | 257/413 |
| 5,619,051 | 4/1997 | Endo | 257/316 |

FOREIGN PATENT DOCUMENTS

| | | | |
|---|---|---|---|
| 406236994 | 8/1994 | Japan | 257/411 |

*Primary Examiner*—Mahshid D. Saadat
*Assistant Examiner*—Ida Marie Soward
*Attorney, Agent, or Firm*—William W. Holloway; Wade James Brady, III; Richard L. Donaldson

[57] ABSTRACT

In an integrated circuit, gate electrode stack of which is subjected to self-alignment processes, the sheet resistance is lowered by including a tungsten layer 15. The tungsten layer 14 is protected by a sidewall material 21 of $SiN_x$ or $SiO_2$ after an etching step which did not extend to the substrate 11. During a subsequent etching step in which the stack extends to the substrate 11, the sidewall material 31 acts as a hard mask protecting the upper portion of the stack. After the lower portion of the stack is protected by a re-oxidation layer 41, the entire stack can be processed further without deterioration of the sheet resistance of the tungsten layer 15.

7 Claims, 1 Drawing Sheet

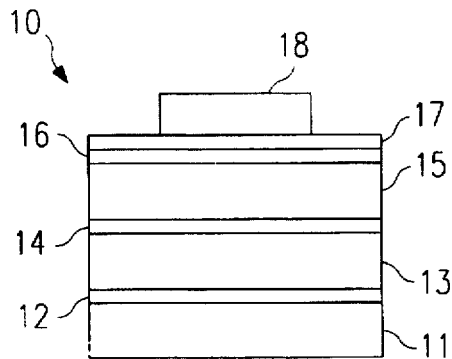

FIG. 1

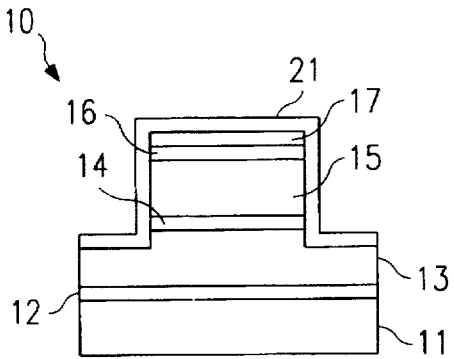

FIG. 2

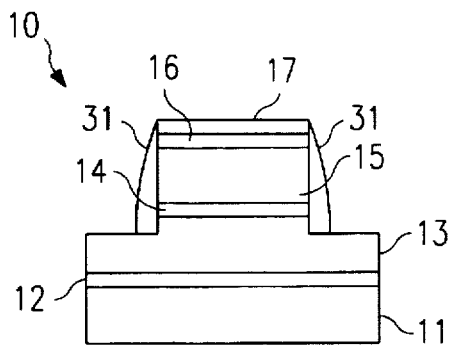

FIG. 3

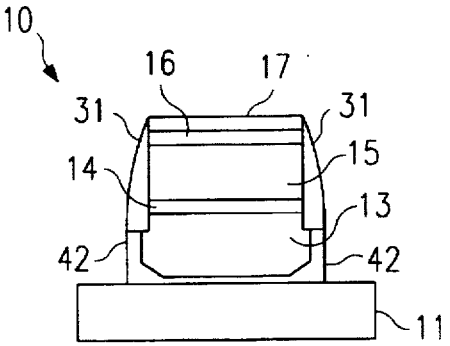

FIG. 4

501 — REMOVE MATERIAL FROM AT LEAST A LAYER OF TUNGSTEN OR MOLYBDENUM TO CREATE AN UPPER STACK PORTION EXTENDING TO OR INTO THE POLY-SILICON LAYER

502 — FORM A SIDEWALL SPACER OF $Si_{(2x+1)}N_{4x}O_{(2-2x)}$, (where x=0->1) FOR THE UPPER STACK PORTION 503 — USING THE UPPER STACK PORTION AND THE SIDEWALL SPACER AS A MASK, CREATE A LOWER STACK PORTION EXTENDING TO THE SUBSTRATE

504 — FORM A SIDEWALL SPACER FOR THE LOWER STACK PORTION

FIG. 5

SEMICONDUCTOR STACK HAVING A DIELECTRIC SIDEWALL FOR PREVENTION OF OXIDATION OF TUNGSTEN IN TUNGSTEN CAPPED POLY-SILICON GATE ELECTRODES

BACKGROUND OF THE INVENTION

1. Field of the Invention

This invention relates to the fabrication of integrated circuit devices and, more particularly, to the fabrication of poly-silicon gate electrodes forming an integral part of the selected integrated circuit components.

2. Description of the Related Art

In order to reduce the sheet resistance of a poly-silicon gate electrode, the use of a tungsten-capped poly-silicon stack has been proposed. However, to be compatible with the self-alignment contact process, the tungsten capped poly-silicon gate should 1.) have thermal stability up to 900° C. for 27 minutes in a nitrogen atmosphere without degradation of the sheet resistance and gate integrity; and 2.) have stability against oxidation up to 800° C. for 30 minutes in an air atmosphere.

A need has therefore been felt for process by which a tungsten layer can be incorporated into a poly-silicon gate electrode to reduce the resistance of the gate electrode while maintaining the desirable physical properties during the self alignment contact process procedures.

SUMMARY OF THE INVENTION

The aforementioned and other features are accomplished, according to the present invention, by providing an etching procedure which is stopped at the poly-silicon layer after etching a tungsten layer and a diffusion barrier layer. A protective layer of $SiO_2$ or a layer of $SiN_x$ is then formed over the exposed surface. The layer of $SiO_2$ or $SiN_x$ is etched in such a manner to provide a sidewall spacer on the exposed portions of the sides of the stack. The stack is then etched through a poly-silicon layer and a gate oxide (insulating) layer to the silicon substrate, with the previously etched portions of the stack and the sidewall spacer acting as hardmask for the further etching of the stack. A re-oxidation step reduces the etch damage to the gate oxide and reduces the leakage current at the bottom corner of the stack gate. The transistor stack, including the tungsten layer, retains the desirable physical characteristics after a processing operation which would, without the present procedures, have resulted in deterioration of these physical characteristics.

These and other features of the present invention will be understood upon the reading of the following description in conjunction with the Figures.

BRIEF DESCRIPTION OF THE DRAWINGS

FIG. 1 shows the gate structure after the photoresist material has been applied to the gate structure and the photoresist material has been patterned.

FIG. 2 shows the gate structure after the removal of the material not shadowed by the photoresist material, the photoresist material having been removed and a nitride coating has been applied.

FIG. 3 shows the gate structure after a sidewall etch has removed a portion of the nitride coating.

FIG. 4 shows the gate structure after a re-oxidation step.

FIG. 5 is a process diagram illustrating how to provide a device stack with a tungsten (or molybdenum)-capped poly-silicon gate electrode according to the present invention.

DESCRIPTION OF THE PREFERRED EMBODIMENT

1. Detailed Description of the Drawings

Referring first to FIG. 1, the gate structure 10 is shown after the deposition and patterning of the photoresist material 18. The substrate 11 has a gate insulating (oxide) layer 12 formed thereon. Over the gate oxide layer 12 is formed a poly-silicon layer 13, the poly-silicon layer being formed in the preferred embodiment by low pressure chemical vapor deposition with a thickness of approximately 700–800 Angstroms. A diffusion barrier layer 14 of either titanium nitride, tungsten nitride, $Ti_x Al_{(1-x)} N_y$, or other materials (of approximately 50–200 Angstroms in thickness), which can block the inter-diffusion of tungsten and silicon, is formed on the poly-silicon layer 13 using either physical vapor deposition or chemical vapor deposition. A tungsten layer 15 of approximately 500–800 Angstroms using either chemical vapor deposition or physical vapor deposition is formed on the diffusion barrier layer 14. Over the tungsten layer 15 is formed a $Si_{(2x+1)}N_{(4x)}O_{(2-2x)}$ (where x=0→1) layer 16, and subsequently, an $Si_xNi_4$ (where x ≧3) layer 17 is formed on the stack using a low pressure chemical vapor deposition (LPCVD) technique. The purpose of layer 16 is to protect the tungsten from oxidation during subsequent LPCVD deposition of $SiN_x$. Therefore, layer 16 is deposited at a temperature less than 400° C., e.g., by plasma enhanced chemical vapor deposition with conventional plasma or electron cyclotron (ECR) plasma. Layer 16 is optional if the LPCVD $Si_xN_4$ (where x≧3) layer 17 is deposited in a deposition tool or chamber with following conditions, i.e., to prevent the tungsten from oxidation before the $Si_xN4$ (where x≧3) deposition:

1. The wafers are loaded through an evacuated load-lock chamber into the deposition tube or chamber while the deposition tube or chamber is evacuated and maintained at an elevated temperature under; or
2. The wafer is loaded into a deposition tube or chamber maintained at a low temperature (<100° C. ). After evacuating the deposition tube or chamber, the wafer temperature is elevated to the desired temperature. A photoresist material layer 18 is deposited on the $Si_xN_4$ (where x≧3) layer 17 and patterned.

Referring to FIG. 2, the patterned photoresist layer 18 is used to control the stack etching. The stack is etched to stop on or in the poly-silicon layer 13. After removing the remaining photoresist material and etch residues, a thin layer 21 of $Si_3N_4$ is formed over the exposed surface. Preferred deposition methods for this thin layer 21 of $Si_3N_4$ are the plasma enhanced chemical vapor deposition (with either an RF plasma or an electron cyclotron plasma) or a low pressure chemical vapor deposition with an evacuation step prior to deposition.

Referring to FIG. 3, the $Si_3N_4$ layer 21 is anisotropically etched to provide a sidewall spacer 31. The etch can be performed by a reactive ion etch or other anisotropic etch methods.

Referring to FIG. 4, the $Si_3N_4$ layer 21 is used as a hard mask for the etching of poly-silicon layer 13, stopping on gate oxide layer 12. The whole stack 10 is processed with an oxidation step at 800°±200° C. to form an additional oxide region 42 at the edge of the poly-silicon layer and to repair damage to the gate oxide layer 12. The $Si_3N_4$ layer 21 has lower oxygen permeability, and thus will prevent tungsten from oxidizing during the 800°±200° C. oxidation step.

Referring to FIG. 5, the process for fabricating a device having a tungsten (or molybdenum)-capped poly-silicon gate, according to the present invention, is illustrated. In step 501, an upper stack portion, including a tungsten or molybdenum layer, is formed which extends to the poly-silicon layer. The upper stack is typically formed by removal of (layer) material not shadowed by a (photoresist) mask. In step 502, a layer of material $Si_{(2x+1)}N_{4x}O_{(2-2x)}$ (where $x=0\rightarrow1$) is applied to the resulting structure and anisotropically processed to provide a sidewall spacer around the upper stack portion. In step 503, a lower stack portion is formed, to the substrate, by removing material shadowed by the upper stack portion and the sidewall spacer. In step 504, a second sidewall spacer is formed around the lower stack portion, i.e. by an oxidation step in the preferred embodiment.

2. Operation of the Preferred Embodiment(s)

While the previous discussion has been devoted to a $Si_3N_4$ capping layer 21, a $SiO_2$ or $Si_{(2x+1)}N_{4x}O_{(2-2x)}$ (where $x=0\rightarrow1$) capping layer can similarly be used protect against the deterioration of the a stack tungsten layer.

Referring to Table 1, effect of processing on the sheet resistance of the tungsten layer is shown. The stack being tested included a tungsten layer of approximately 800 Angstroms, a titanium nitride layer of approximately 100 Angstroms, a poly-silicon layer, a gate oxide layer, and a silicon layer. The annealing process takes place for 20 minutes in an oxygen atmosphere at 850° C. As will be clear from Table 1, the

TABLE 1

| Capping Layer | Initial Rs (ohms/square) | Final Rs (ohms/square) |
|---|---|---|
| $SiO_2$ (3k Angstroms) | 2.34 | 1.96 |
| $Si_3N_4$ (1k Angstroms) | 2.34 | 1.66 |
| $Si_3N_4$ (3k Angstroms) | 2.34 | 1.65 | resistivity of the tungsten layer is lowered during the processing operation. Therefore, the procedure described herein provides a viable technique to lowering the sheet resistance of a transistor stack by including a tungsten layer. The procedure includes process steps which protect the tungsten layer from deterioration during the self-alignment contract processing steps.

While the invention has been described with particular reference to the preferred embodiment, it will be understood by those skilled in the art that various changes may be made and equivalents substituted for elements of the preferred embodiment without departing from the invention. For example, the presence of the gate insulating layer and the diffusion barrier layer of the stack structure are not necessary to practice the invention. In the absence of these layers, the procedure for forming the sidewall regions would remain the same. The diffusion barrier layer, by way of specific example, is not necessary when additional processing does not involve temperatures above 550° C. Furthermore, although this invention has been described with respect to a tungsten conducting layer, a molybdenum conducting layer can also be used to improve the conductivity of the poly-silicon layer. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A semiconductor stack formed on a substrate, said stack comprising:

a gate oxide layer formed on said substrate;

a poly-silicon layer formed on said gate layer oxide, wherein said poly-silicon layer and said gate oxide layer have an oxide sidewall;

a diffusion barrier layer formed on said poly-silicon layer; and a conducting layer formed on said diffusion barrier layer, said conducting layer selected from at least one of the group of materials consisting of tungsten and molybdenum wherein said diffusion barrier layer and said conducting layer having a sidewall barrier comprised of $SiN_x$.

2. The stack of claim 1 further comprising a $SiN_x$ layer formed on said conducting layer.

3. The stack of claim 1 wherein said sidewall barrier provides a hard mask for the etching stopping on or in a poly-silicon region and a gate oxide region to form said poly-silicon layer and said gate oxide layer.

4. A semiconductor stack including a conducting layer in an integrated circuit electrode rate stack, said conducting layer selected from at least one of the materials of the croup consisting of tungsten and molybdenum, said stack formed steps of:

forming on a substrate, in order, a rate insulating layer, a poly-silicon layer, a diffusion barrier layer, a conducting layer, a $Si_xN_4$ (x>3) layer, and a photoresist layer;

removing portions of said layers, where photoresist is not present at least to said poly-silicon layer, to form a first stack of layers;

forming a sidewall region of a material from a group of materials including $Si_3N_4$, $SiO_2$, and $Si_{(2x+1)}N_{4x}O_{(2-2x)}$ (where $x=0\rightarrow1$);

removing material from said electrode rate stack to said substrate where said first stack and sidewall region are not present; and re-oxidizing said exposed poly-silicon layer and said gate oxide layer.

5. A stack structure comprising:

a substrate;

a poly-silicon layer formed on said substrate;

a sidewall oxide formed on a wall of said poly-silicon layer;

a conducting layer on said poly-silicon layer, said conducting layer selected from at least one of the group of materials consisting of tungsten and molybdenum; and a sidewall material formed on a wall of said conducting layer, said sidewall material consisting of $SiN_x$ (where $x=1\geq2$).

6. The stack structure of claim 5 further comprising a gate insulating layer between said substrate and said poly-silicon layer, said oxide layer also formed on a wall of said gate insulating layer.

7. The stack structure of claim 5 further comprising a diffusion barrier layer between said poly-silicon layer and said conducting layer, said sidewall material formed on a wall of said diffusion barrier layer.

* * * * *